United States Patent
Schifko et al.

(10) Patent No.: US 6,277,747 B1
(45) Date of Patent: Aug. 21, 2001

(54) METHOD FOR REMOVAL OF ETCH RESIDUE IMMEDIATELY AFTER ETCHING A SOG LAYER

(75) Inventors: James R. Schifko, San Antonio; Danny R. Oldham, Boerne, both of TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 09/188,226

(22) Filed: Nov. 9, 1998

(51) Int. Cl.⁷ .................................................. H01L 21/302
(52) U.S. Cl. .................... 438/689; 438/697; 438/706; 438/745
(58) Field of Search ................... 438/689, 697, 438/706, 745

(56) References Cited

U.S. PATENT DOCUMENTS

| | | | |
|---|---|---|---|
| 5,733,712 | * 3/1998 | Tanaka et al. | 430/314 |
| 5,798,568 | * 8/1998 | Abercrombie et al. | 257/758 |
| 5,854,503 | * 12/1998 | Hsueh et al. | 257/347 |
| 5,880,018 | * 3/1999 | Boeck et al. | 438/619 |
| 5,902,780 | * 5/1999 | Lee | 510/176 |
| 5,937,324 | * 8/1999 | Abercrombie et al. | 438/648 |

* cited by examiner

Primary Examiner—Benjamin L. Utech
Assistant Examiner—Vanessa Perez-Ramos
(74) Attorney, Agent, or Firm—Roland P. Kananen; Rader, Fishman & Grauer

(57) ABSTRACT

A semiconductor manufacturing method is disclosed, which includes the steps of: forming an interconnect layer, which may include aluminum, on a semiconductor substrate; forming an anti-reflective coating which may comprise titanium; forming a spin on glass layer; selectively etching portions of the spin on glass layer, so that predetermined portions of the interconnect layer are exposed; and applying an EKC solution to predetermined portions of the interconnect layer that are exposed. The semiconductor manufacturing may also include the steps of forming a first tetra-ethyl-ortho-silicate layer, before the step of forming a spin on glass layer; and forming a second tetra-ethyl-ortho-silicate layer, following the step of applying an EKC solution. The EKC solution in the preferred embodiment is applied for at least about a 10 minute process time. Furthermore, the semiconductor manufacturing method may include the step of forming a second interconnect layer.

11 Claims, No Drawings

METHOD FOR REMOVAL OF ETCH RESIDUE IMMEDIATELY AFTER ETCHING A SOG LAYER

BACKGROUND OF THE INVENTION

During manufacture of a semiconductor device, interconnect layers are often created using aluminum or other conductive elements and compounds. Following formation of an interconnect, a spin-on-glass (SOG) plasma etch back step is performed to planarize the exposed semiconductor surface, including the exposed aluminum interconnect and an anti-reflective coating (ARC). A titanium compound forms in globs, or bumps on the semiconductor wafer during SOG etch back when the ARC film is exposed to the plasma. The bumps remain on the wafer, and are easily seen in high concentrations at 40×, all over the wafer. The bumps can be 1000 Angstroms or greater in both height and width. As a result, the semiconductor product must be scrapped.

Past attempts at cleaning or otherwise removing titanium containing bumps on semiconductor leads have resulted in peeling of the fully manufactured semiconductor. Some attempts have resulted in faulty semiconductors, i.e. having poison vias.

It is therefore an object of the present invention to safely manufacture semiconductors having interconnect leads and anti-reflective coating. It is another object of the invention to perform an etching process on such a semiconductor without permanent formation of titanium-containing clusters or bumps, especially on the interconnect leads. It is yet another object of the present invention to manufacture such a semiconductor without detrimental effects to the final product such as peeling and poison vias.

SUMMARY OF THE INVENTION

The present invention is directed to a semiconductor manufacturing method, which includes the steps of: forming an interconnect layer, which may comprise aluminum, on a semiconductor substrate; forming an anti-reflective coating; forming a spin on glass layer; selectively etching portions of the spin on glass layer, whereby predetermined portions of the interconnect layer are exposed; and applying an EKC solution to predetermined portions of the interconnect layer that are exposed.

The semiconductor manufacturing may also include the steps of forming a first tetra-ethyl-ortho-silicate layer, before the step of forming a spin on glass layer; and forming a second tetra-ethyl-ortho-silicate layer, following the step of applying an EKC solution. The EKC solution in the preferred embodiment has a three day bath life and is applied for at least about a 10 minute process time. Furthermore, the semiconductor manufacturing method may include the step of forming a second interconnect layer.

The semiconductor manufacturing method may further include forming an anti-reflective cover layer which comprises titanium in elemental form, or as a compound with other elements, prior to the step of selectively etching portions of the spin on glass layer.

Another embodiment of the present invention is directed to a semiconductor manufacturing method, which includes the steps of: forming an interconnect layer, and an anti-reflective layer, on a semiconductor substrate; forming a spin on glass layer; selectively etching portions of the spin on glass layer, so that predetermined portions of the interconnect layer and the anti-reflective layer are exposed; and subjecting the semiconductor substrate and at least a portion of the interconnect layer to a treatment so that a residual product of the selectively etching step is removed. The residual product of the selectively etching step may include clusters of TiON. In a preferred embodiment, these clusters chemically react with a solution comprising EKC.

DESCRIPTION OF THE PREFERRED EMBODIMENT

The following is a description of the method for manufacturing a semiconductor according to the principles of the present invention. More particularly, by the method described below, a semiconductor free of metal-containing irregularities, or bumps on the metal interconnection layer.

An interconnect is first formed on a semiconductor substrate, e.g. a bare silicon wafer. In a preferred embodiment of the invention, the interconnect is made of aluminum, and the aluminum is deposited from a chemical composition containing aluminum at 99% by weight or greater. Other metals may also be present at various concentrations according to the desired properties of the interconnect and the deposition conditions. The aluminum may be deposited by, for example, physical vapor deposition.

Following deposition of the interconnect, an anti-reflective coating (ARC) is deposited over the exposed surface of the semiconductor, including the interconnect. TiON is a commonly used ARC, which is also deposited by physical vapor deposition.

A first tetra-ethyl-ortho-silicate (TEOS) layer, approximately 4000 Angstroms in thickness, is then deposited over the interconnect/ARC layers. The TEOS layer may be deposited by plasma CVD. However, other CVD methods such as low pressure CVD, atmospheric pressure CVD, and the like may also be employed for the TEOS deposition.

Following deposition of the TEOS layer, a spin-on-glass (SOG) coating layer is deposited in a liquid phase over the exposed surfaces of the semiconductor wafer. Spin-on glass deposition is an example of a sol-gel process. The unprocessed spin-on glass material (available in numerous formulations) is actually a gel. After the liquid material is coated onto the face of a wafer, the wafer is rotated at high speed to throw off the excess material. The surface tension and adhesion of the material provides a planarized surface with a controlled thickness. The liquid material is then baked, to drive off solvents and provide a stable solid silicate glass.

Following the deposition of the SOG layer, a reactive ion etching process is performed to selectively etch portions of the SOG layer, thereby exposing predetermined portions of the previously deposited interconnect layer. As a result of the reactive ion etching process, portions of the ARC are exposed to the plasma containing $CHF_3$, $CF_4$ and Argon gas. $C_4F_8$ and other commonly used compounds may also be used for the reactive ion etching process. As a result of the exposure of the ARC to the plasma, a Ti containing polymer compound is formed in bumps that adhere mainly in worst case to the Al interconnect leads, but are found all over the wafer. These bumps can be 1000 or more Angstroms in width, and 1000 or more Angstroms in height.

Following the reactive ion etching process, the exposed surfaces of the semiconductor wafer are sprayed using a hydroxylamine based solution. EKC is used in a preferred embodiment, a commercial solvent sold to remove etch residue for via etch processes, which contains water, alkanolamine, catechol, and hydroxylamine. In a preferred embodiment of the invention, EKC-365, produced by EKC Technology, Inc. is sprayed on the exposed surfaces. The wafer can be exposed for as long as needed to remove the TiON bumps formed on the interconnect leads. The EKC solution in the preferred embodiment is applied for at least about ten minutes. As a result of the EKC treatment, no bumps are present on any of the wafer surfaces.

In another embodiment of the invention, following the EKC treatment, a second TEOS layer is formed on the exposed surfaces of the semiconductor wafer. The TEOS layer is about 1000 Angstroms in thickness in a preferred embodiment. A phosphosilicate glass layer is then deposited over the TEOS layer. Next, a second interconnect layer is deposited in a similar manner as the first interconnect layer. An ARC layer is then deposited on the interconnect layer in a manner similar to the first ARC deposition.

Following deposition of the interconnect/ARC layers, the semiconductor wafer is subject to sintering in a furnace. Upon cooling of the wafer, a polysilica nitrite (PSiN) layer is deposited by plasma CVD. The PSiN layer may be up to 10,000 or more Angstroms in thickness.

Following the above procedure, and particularly following EKC treatment, the semiconductor wafers were inspected at 400× in light and dark fields. No TiON bumps were present at any point on the semiconductor wafer. Furthermore, the manufactured semiconductors were tested for poison vias using a detection method which employed visual inspection and electrical testing instrumentation. Test results were negative, even following methods where the TEOS layer were up to 4500 Angstroms in thickness, and the etching procedure etched back up to 4600 Angstroms.

Furthermore, numerous wafers that had the above EKC treatments were tested for peeling against wafers that were not subjected to the EKC treatment. Some of the wafers were partially etched, meaning the etching was performed about half way through the SOG layer, using the CHF3/CF4/Ar mixture. Others were totally etched, meaning the entire SOG was etched, exposing the first TEOS layer. The results of the test are as follows:

| Wafer # | Etching | EKC clean | Peeling |
| --- | --- | --- | --- |
| 1 | Partial | Yes | No |
| 2 | Partial | Yes | No |
| 3 | Partial | No | No |
| 4 | Total | Yes | No |
| 5 | Total | Yes | No |
| 6 | Total | No | No |
| 7 | Total | No | No |

The peeling test was performed using adhesive strips. Three strips were used per wafer, and the test was repeated on the same spot on the wafer with each strip. As shown above, peeling was not observed in any of the wafers, even when the test was performed 48 hours following the EKC treatment. It is evident that an advantage of the present invention is no adverse peeling effects as sometimes results from attempts to remove TiON bumps or from other cleaning processes.

Having described an embodiment of the invention, it is to be understood that the invention is not limited to any of the precise embodiments described herein. Various changes and modifications could be effected by one skilled in the art without departing from the spirit or scope of the invention as defined in the appended claims.

What is claimed is:

1. A semiconductor manufacturing method, which comprises the steps of:

forming an interconnect layer on a semiconductor substrate;

forming an anti-reflective coating over said interconnect layer;

forming a first tetra-ethyl-ortho-silicate layer;

forming a spin on glass layer over said interconnect layer and said anti-reflective coating;

selectively etching portions of said spin on glass layer, whereby portions of said interconnect layer are exposed;

applying a hydroxylamine based solution comprising EKC, at least to said portions of said interconnect layer that are exposed; and forming a second tetra-ethyl-ortho-silicate layer.

2. A semiconductor manufacturing method as claimed in claim 1, wherein said solution comprising EKC is applied for at least about a 10 minute process time.

3. A semiconductor manufacturing method as claimed in claim 1, further comprising the step of:

after applying a second tetra-ethyl-ortho-silicate layer, forming a second interconnect layer.

4. A semiconductor manufacturing method as claimed in claim 1, wherein said interconnect layer comprises aluminum.

5. A semiconductor manufacturing method as claimed in claim 4, wherein said anti-reflective cover layer comprises titanium.

6. A semiconductor manufacturing method, which comprises the steps of:

forming an interconnect layer, and an anti-reflective layer, on a semiconductor substrate;

forming a spin on glass layer;

selectively etching portions of said spin on glass layer, whereby portions of said interconnect layer and said anti-reflective layer are exposed;

subjecting said semiconductor substrate and at least a portion of said interconnect layer to a treatment whereby a residual product of said selectively etching step is removed applying a tetra-ethyl-ortho-silicate layer following said subjecting said semiconductor substrate and at least a portion of said interconnect layer to a treatment whereby a residual product of said selectively etching step is removed; and forming a second interconnect layer.

7. A semiconductor manufacturing method as claimed in claim 6, wherein said residual product of said selectively etching step comprises clusters of TiON.

8. A semiconductor manufacturing method as claimed in claim 6, further comprising the step of:

forming a second tetra-ethyl-ortho-silicate layer, before said step of forming a spin on glass layer.

9. A semiconductor manufacturing method as claimed in claim 6, wherein said treatment comprises a chemical reaction involving a solution comprising a hydroxylamine.

10. A semiconductor manufacturing method as claimed in claim 9, wherein said solution comprising a hydroxylamine is applied to said semiconductor wafer for at least about a 10 minute process time.

11. A semiconductor manufacturing method as claimed in claim 6, wherein said interconnect layer comprises aluminum.

* * * * *